United States Patent
Reddy et al.

(10) Patent No.: US 10,212,852 B1
(45) Date of Patent: Feb. 19, 2019

(54) APPARATUS, SYSTEM, AND METHOD FOR IMPROVED THERMAL CONTACT BETWEEN HEATSINKS AND FIELD-REPLACEABLE ELECTRONIC MODULES

(71) Applicant: Juniper Networks, Inc., Sunnyvale, CA (US)

(72) Inventors: Anuya Reddy, Bangalore (IN); Raveen Jagadeesan, Bangalore (IN); Senthil Kumar Ramaswamy Venkat, Bangalore (IN)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 15/653,488

(22) Filed: Jul. 18, 2017

Related U.S. Application Data

(63) Continuation-in-part of application No. 15/445,278, filed on Feb. 28, 2017.

(51) Int. Cl.
  *H05K 7/20* (2006.01)
  *H05K 7/14* (2006.01)
  *F28F 3/02* (2006.01)

(52) U.S. Cl.
  CPC ......... *H05K 7/20709* (2013.01); *F28F 3/022* (2013.01); *H05K 7/1489* (2013.01); *F28F 2275/08* (2013.01); *F28F 2275/14* (2013.01)

(58) Field of Classification Search
  CPC ... H05K 7/20709; H05K 7/1489; F28F 3/022; F28F 2275/08; F28F 2275/14
  See application file for complete search history.

(56) References Cited

U.S. PATENT DOCUMENTS

| | | | |
|---|---|---|---|
| 6,942,506 B2 * | 9/2005 | Kimura | H01L 23/4093 174/16.3 |
| 7,667,972 B2 * | 2/2010 | Chen | G06K 7/0047 165/104.33 |

(Continued)

OTHER PUBLICATIONS

Anuya Reddy, et al; Apparatus, System, and Method for Improved Thermal Contact Between Heatsinks and Field-Replaceable Electronic Modules; U.S. Appl. No. 15/445,278, filed Feb. 28, 2017.

*Primary Examiner* — David M Sinclair
*Assistant Examiner* — Robert D Brown
(74) *Attorney, Agent, or Firm* — FisherBroyles, LLP

(57) ABSTRACT

The disclosed apparatus may include (1) a cage that houses at least one field-replaceable electronic module that, when operational, emits heat within a computing device, wherein the cage comprises (A) a front entry side that facilitates installation of the field-replaceable electronic module and (B) a back side that is located opposite the front entry side, (2) a heatsink that removably interfaces with the field-replaceable electronic module when the field-replaceable electronic module is installed in the cage, and (3) a spring plate that (A) is coupled to the heatsink and (B) applies force to the heatsink such that the heatsink (I) is pressed against the field-replaceable electronic module and (II) establishes thermal contact with the field-replaceable electronic module to facilitate heat transfer from the field-replaceable electronic module to the heatsink. Various other apparatuses, systems, and methods are also disclosed.

16 Claims, 11 Drawing Sheets

(56) References Cited

U.S. PATENT DOCUMENTS

| | | | | |
|---|---|---|---|---|
| 8,911,244 B2* | 12/2014 | Elison | ................ | H05K 7/20409 439/137 |
| 2008/0278914 A1* | 11/2008 | Chen | .................... | G06K 7/0047 361/709 |
| 2013/0077254 A1* | 3/2013 | Nguyen | ................ | G02B 6/4261 361/715 |
| 2014/0170898 A1* | 6/2014 | Elison | ................ | H05K 7/20454 439/487 |
| 2014/0185988 A1* | 7/2014 | Qi | ......................... | G02B 6/428 385/77 |

* cited by examiner

APPARATUS, SYSTEM, AND METHOD FOR IMPROVED THERMAL CONTACT BETWEEN HEATSINKS AND FIELD-REPLACEABLE ELECTRONIC MODULES

CROSS REFERENCE TO RELATED APPLICATION

This application is a continuation-in-part of U.S. application Ser. No. 15/445,278, filed 28 Feb. 2017, the disclosure of which is incorporated, by this reference, in its entirety.

BACKGROUND

Network devices often include field-replaceable electronic modules that emit heat during operation. To ensure reliable performance, these field-replaceable electronic modules may need to stay within a certain temperature range. Accordingly, network device manufacturers may apply heatsinks to the field-replaceable electronic modules to remove some of the heat and/or maintain their temperatures within the reliable range.

Unfortunately, traditional applications of such heatsinks may have certain deficiencies and/or shortcomings. For example, some field-replaceable electronic modules and/or heatsinks may include certain irregularities caused by imperfect manufacturing processes. As a result, a certain amount of air gap may form between the heatsinks and field-replaceable electronic modules. These air gaps may impede and/or negatively impact the heat transfer from the field-replaceable electronic modules to the heatsinks, thereby potentially causing the field-replaceable electronic modules to perform sub-optimally and/or even causing them to fail altogether.

The instant disclosure, therefore, identifies and addresses a need for apparatuses, systems, and methods that facilitate and/or achieve improved thermal contact between heatsinks and field-replaceable electronic modules.

SUMMARY

As will be described in greater detail below, the instant disclosure generally relates to apparatuses, systems, and methods for improved thermal contact between heatsinks and field-replaceable electronic modules. In one example, an apparatus for accomplishing such a task may include (1) a cage that houses at least one field-replaceable electronic module that, when operational, emits heat within a computing device, wherein the cage comprises (A) a front entry side that facilitates installation of the field-replaceable electronic module and (B) a back side that is located opposite the front entry side, (2) a heatsink that removably interfaces with the field-replaceable electronic module when the field-replaceable electronic module is installed in the cage, and (3) a spring mechanism that (A) is coupled to the back side of the cage and (B) applies force to the heatsink such that the heatsink (I) is pressed against the field-replaceable electronic module and (II) establishes thermal contact with the field-replaceable electronic module to facilitate heat transfer from the field-replaceable electronic module to the heatsink.

Similarly, a network device incorporating the above-described apparatus may include (1) a cage that houses at least one field-replaceable electronic module that, when operational, emits heat within a computing device, wherein the cage comprises (A) a front entry side that facilitates installation of the field-replaceable electronic module and (B) a back side that is located opposite the front entry side, (2) a heatsink that removably interfaces with the field-replaceable electronic module when the field-replaceable electronic module is installed in the cage, and (3) a spring mechanism that (A) is coupled to the back side of the cage and (B) applies force to the heatsink such that the heatsink (I) is pressed against the field-replaceable electronic module and (II) establishes thermal contact with the field-replaceable electronic module to facilitate heat transfer from the field-replaceable electronic module to the heatsink.

A corresponding method may include (1) installing a field-replaceable electronic module in a cage of a computing device via a front entry side of the cage, and then during installation of the field-replaceable electronic module (2) engaging, with the field-replaceable electronic module, a stopper pin of a heatsink mounted to the cage such that the field-replaceable electronic module pushes the heatsink toward a back side of the cage that is located opposite the front entry side, (3) locking the field-replaceable electronic module within the cage such that a spring mechanism coupled to the back side of the cage applies force to the heatsink, and as a result of the force applied to the heatsink, (4) causing the heatsink to press against the field-replaceable electronic module and establish a thermal contact with the field-replaceable electronic module to facilitate heat transfer from the field-replaceable electronic module to the heatsink.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
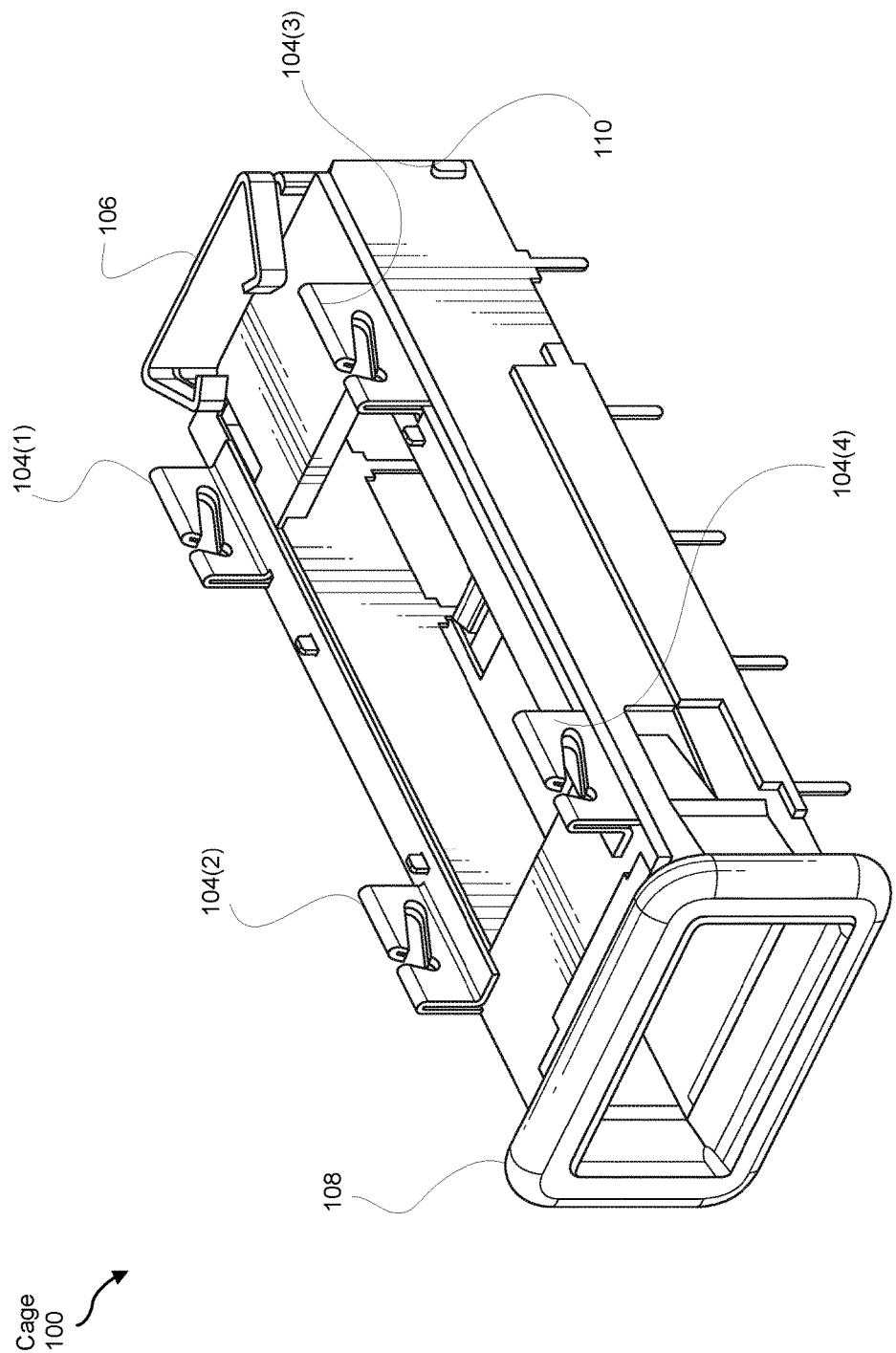
FIG. 1 is an illustration of an exemplary cage that houses a field-replaceable electronic module within a computing device.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for improved thermal contact between heatsinks and field-replaceable electronic modules. As will be explained in greater detail below, embodiments of the instant disclosure may be able to improve such thermal contact by providing a spring mechanism that applies force to a heatsink. This force may cause the heatsink to press against a field-replaceable electronic module and establish a strong thermal contact with the field-replaceable electronic module to facilitate improved heat transfer from the field-replaceable electronic module to the heatsink.

Figure 2:
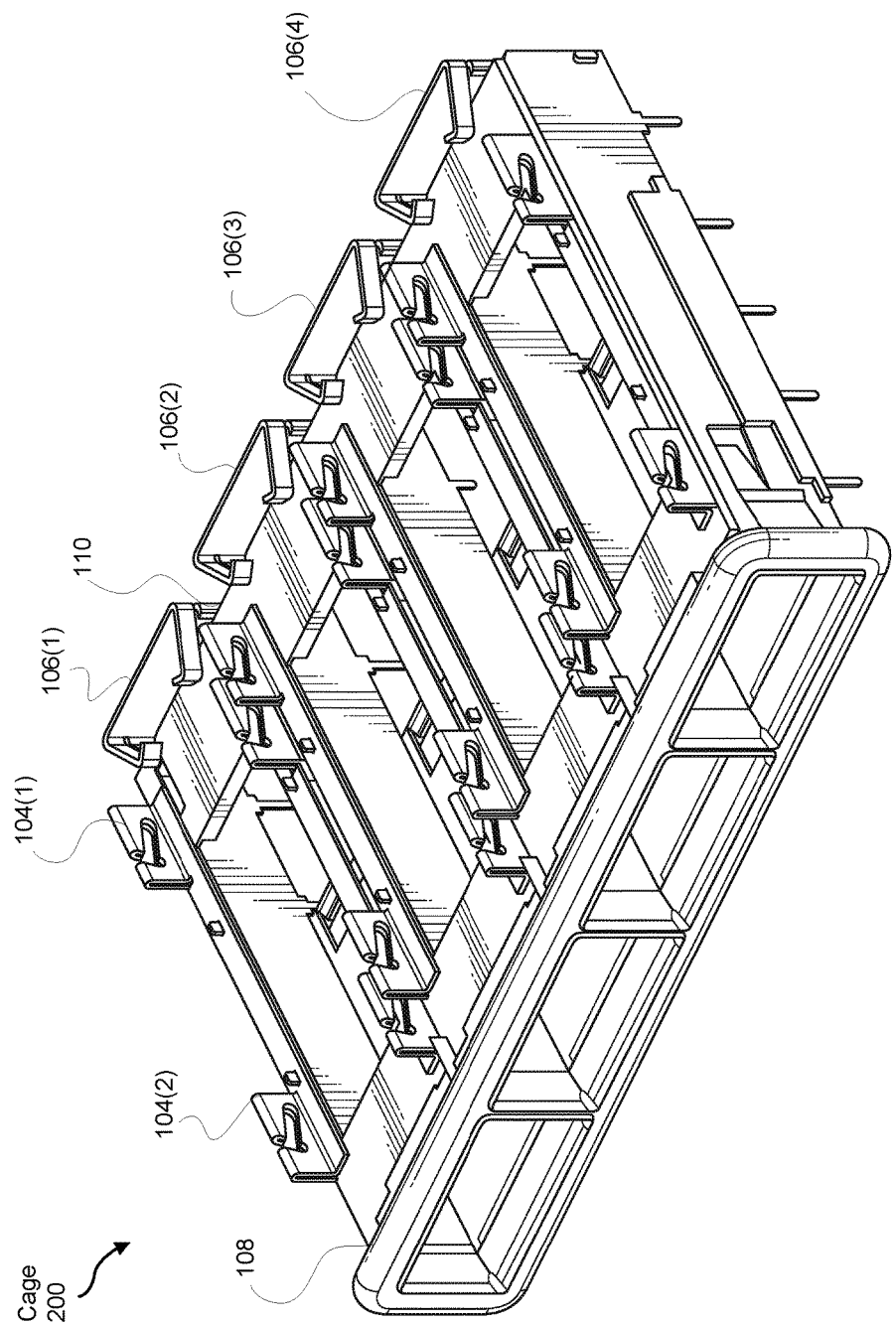
FIG. 2 is an illustration of an exemplary cage that houses multiple field-replaceable electronic modules within a computing device.
Figure 3:
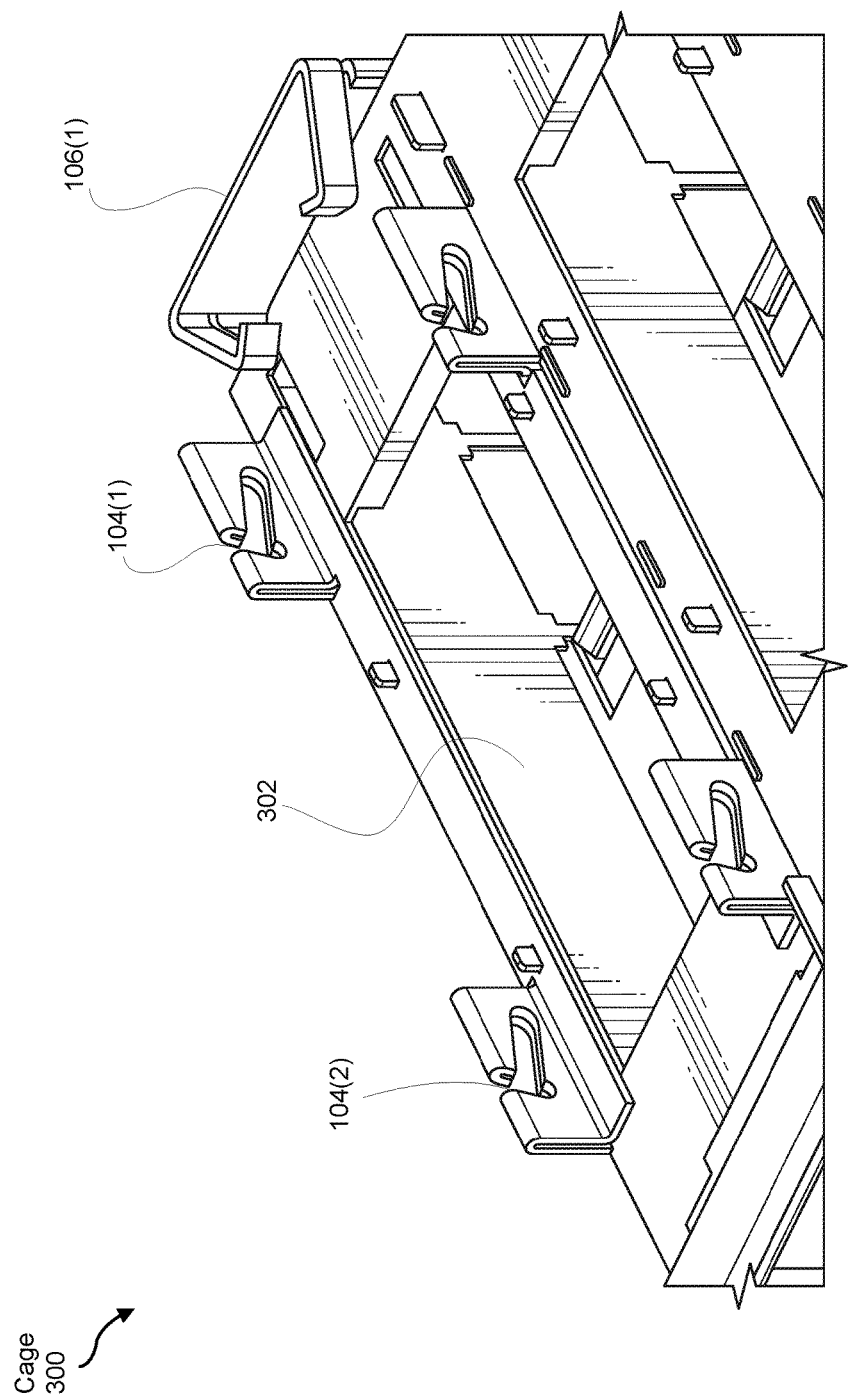
FIG. 3 is an illustration of an exemplary cage that includes a hole in which an extension of a heatsink fits to make contact with a field-replaceable electronic module.

The following will provide, with reference to FIGS. 1-3, examples of cages that houses field-replaceable electronic modules within a computing device. The discussion corresponding to FIGS. 4 and 5 will provide detailed descriptions of exemplary heatsinks that removably interface with a field-replaceable electronic module installed in a cage of a computing device. The discussion corresponding to FIGS. 6-10 will provide detailed descriptions of exemplary apparatuses for improved thermal contact between heatsinks and field-replaceable electronic modules. Finally, the discussion corresponding to FIG. 11 will provide a detailed description of an exemplary method for improved thermal contact between heatsinks and field-replaceable electronic modules.

FIG. 1 shows an exemplary cage 100 that facilitates improved thermal contact between a heatsink and a field-replaceable electronic module. As illustrated in FIG. 1, cage 100 may be designed to house a field-replaceable electronic module (not illustrated in FIG. 1). In this example, cage 100 may include a front entry side 108 that facilitates installation and/or entry of the field-replaceable electronic module. In addition, cage 100 may include a back side 110 that is located opposite front entry side 108.

As illustrated in FIG. 1, cage 100 may also include multiple sliding profile ramps 104(1), 104(2), 104(3), and 104(4). In this example, sliding profile ramps 104(1)-(4) may enable a heatsink (not illustrated in FIG. 1) to mount onto cage 100. For example, a heatsink may include multiple guide pins that interface with sliding profile ramps 104(1)-(4). By interfacing with sliding profile ramps 104(1)-(4) in this way, these guide pins may enable the heatsink to mount and/or be applied to cage 100. Sliding profile ramps 104 (1)-(4) may each include an entry point at which the guide pins of the heatsink enter and/or exit.

As illustrated in FIG. 1, cage 100 may further include a spring mechanism 106 that is coupled to back side 110. In this example, spring mechanism 106 may apply force to the heatsink. As a result of this force, the heatsink may press against the field-replaceable electronic module. In doing so, the heatsink may establish thermal contact with the field-replaceable electronic module to facilitate heat transfer from the field-replaceable electronic module to the heatsink. In addition, cage 100 may include a locking mechanism (not explicitly labelled in FIG. 1) that secures the field-replaceable electronic module within cage 100. Once the field-replaceable electronic module is locked into cage 100 by way of the locking mechanism, spring mechanism 106 may apply force to the heatsink to establish thermal contact with the field-replaceable electronic module.

Spring mechanism 106 may include and/or represent any type or form of spring. Examples of spring mechanism 106 include, without limitation, leaf springs, tension springs, extension springs, horseshoe springs, torsion springs, compression springs, coil springs, constant-force springs, gas springs, combinations or variations of one or more of the same, and/or any other suitable springs.

FIG. 2 shows an exemplary cage 200 that facilitates improved thermal contact between heatsinks and field-replaceable electronic modules. As illustrated in FIG. 2, cage 200 may be designed to house four field-replaceable electronic modules (not illustrated in FIG. 2). In this example, cage 200 may include a front entry side 108 that facilitates installation and/or entry of the field-replaceable electronic modules. In addition, cage 200 may include a back side 110 that is located opposite front entry side 108.

Similar to cage 100 in FIG. 1, cage 200 in FIG. 2 may also include sliding profile ramps 104(1), 104(2), and various others that are not explicitly labeled with reference numbers. In this example, these sliding profile ramps may enable four heatsinks (not illustrated in FIG. 2) to mount onto cage 200. Each heatsink may include multiple guide pins that interface with the corresponding sliding profile ramps. By interfacing with the sliding profile ramps in this way, these guide pins may enable the heatsinks to mount and/or be applied to cage 200.

As illustrated in FIG. 2, cage 200 may further include spring mechanisms 106(1), 106(2), 106(3), and 106(4) that are coupled to back side 110. In this example, spring mechanisms 106(1)-(4) may apply force to the four heatsinks. As a result of these forces, the four heatsinks may press against the four field-replaceable electronic modules. In doing so, the heatsinks may establish thermal contact with the field-replaceable electronic modules to facilitate heat transfer from the field-replaceable electronic modules to the heatsinks.

FIG. 3 shows an exemplary cage 300 that facilitates improved thermal contact between heatsinks and field-replaceable electronic modules. As illustrated in FIG. 3, cage 300 may be designed to house a field-replaceable electronic module (not illustrated in FIG. 2). In this example, cage 300 may include a hole 302 that is designed to fit a portion of a heatsink. The heatsink may make contact with the field-replaceable electronic module by way of hole 302. In other words, an extension of the heatsink may fit within hole 302 and press against the field-replaceable electronic module such that the extension of the heatsink and the field-replaceable electronic module establish thermal contact with one another. This thermal contact may facilitate heat transfer from the field-replaceable electronic module to the heatsink.

Figure 4:
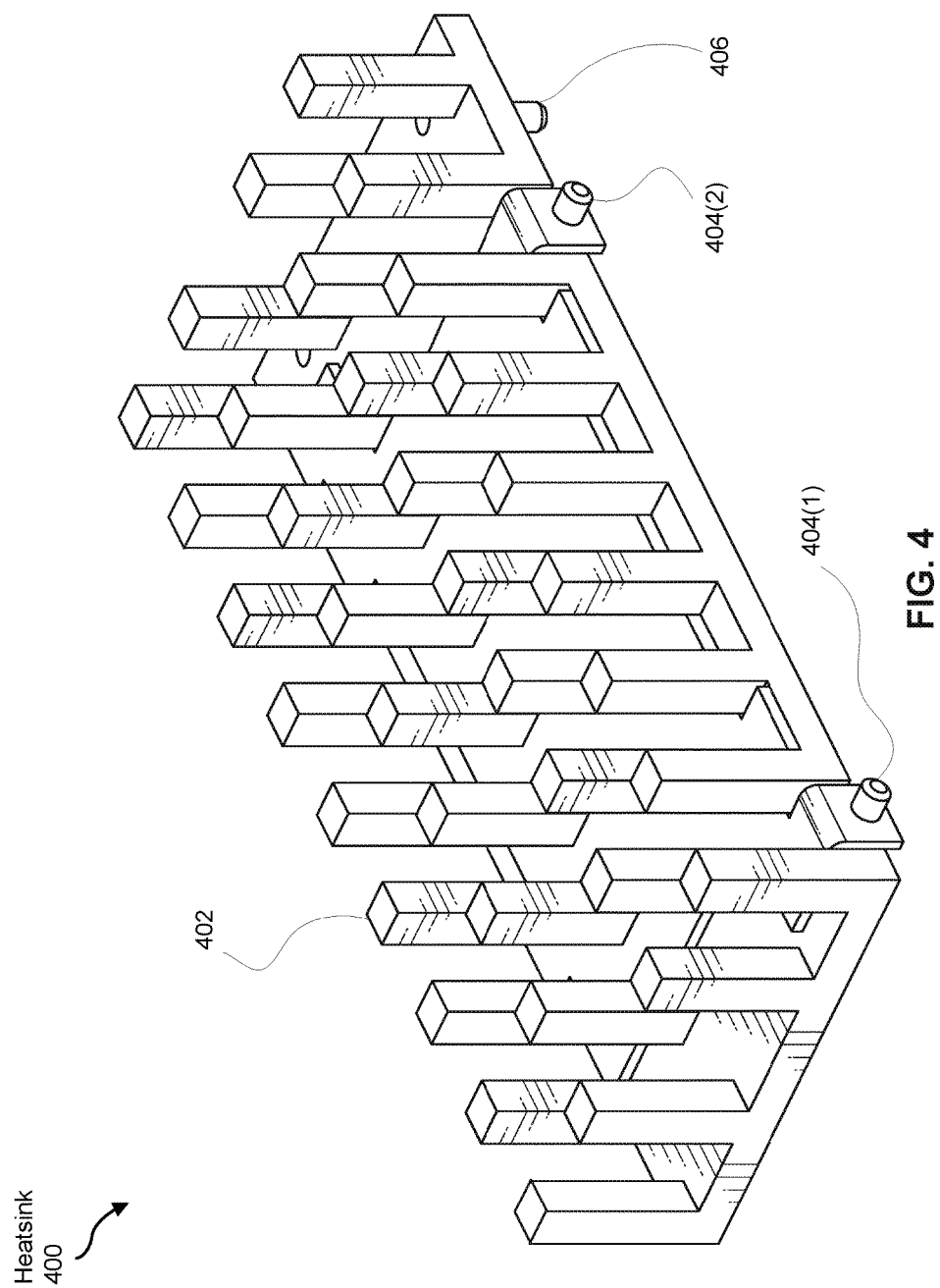
FIG. 4 is an illustration of a heatsink that removably interfaces with a field-replaceable electronic module installed in a cage of a computing device.

FIG. 4 shows an exemplary heatsink 400 that removably interfaces with a field-replaceable electronic module installed in a cage of a computing device. As illustrated in FIG. 4, heatsink 400 may include and/or represent a pin fin heatsink. Although FIG. 4 shows a pin fin heatsink, various other types or forms of heatsinks may be mounted to the cage. In this example, heatsink 400 may include various pins (such as pin 402) that extend from a base. Heatsink 400 may also include guide pins 404(1) and 404(2) (as well as others located on the opposed side not illustrated in FIG. 4). These guide pins may interface with sliding profile ramps 104(1)-(4) of cage 100. Accordingly, these guide pins may enable heatsink 400 to mount onto cage 100 by way of sliding profile ramps 104(1)-(4) to establish thermal contact with the field-replaceable electronic module.

As illustrated in FIG. 4, heatsink 400 may further include at least one stopper pin 406 that interfaces with the field-replaceable electronic module. In this example, stopper pin 406 may enable the field-replaceable electronic module to push heatsink 400 into sliding profile ramps 104(1)-(4) such that heatsink 400 establishes thermal contact with the field-replaceable electronic module. In other words, by pushing heatsink 400 into sliding profile ramps 104(1)-(4) in this way, the field-replaceable electronic module may enable spring mechanism 106 to apply force to heatsink 400 such that heatsink 400 is pressed against the field-replaceable electronic module.

Figure 5:
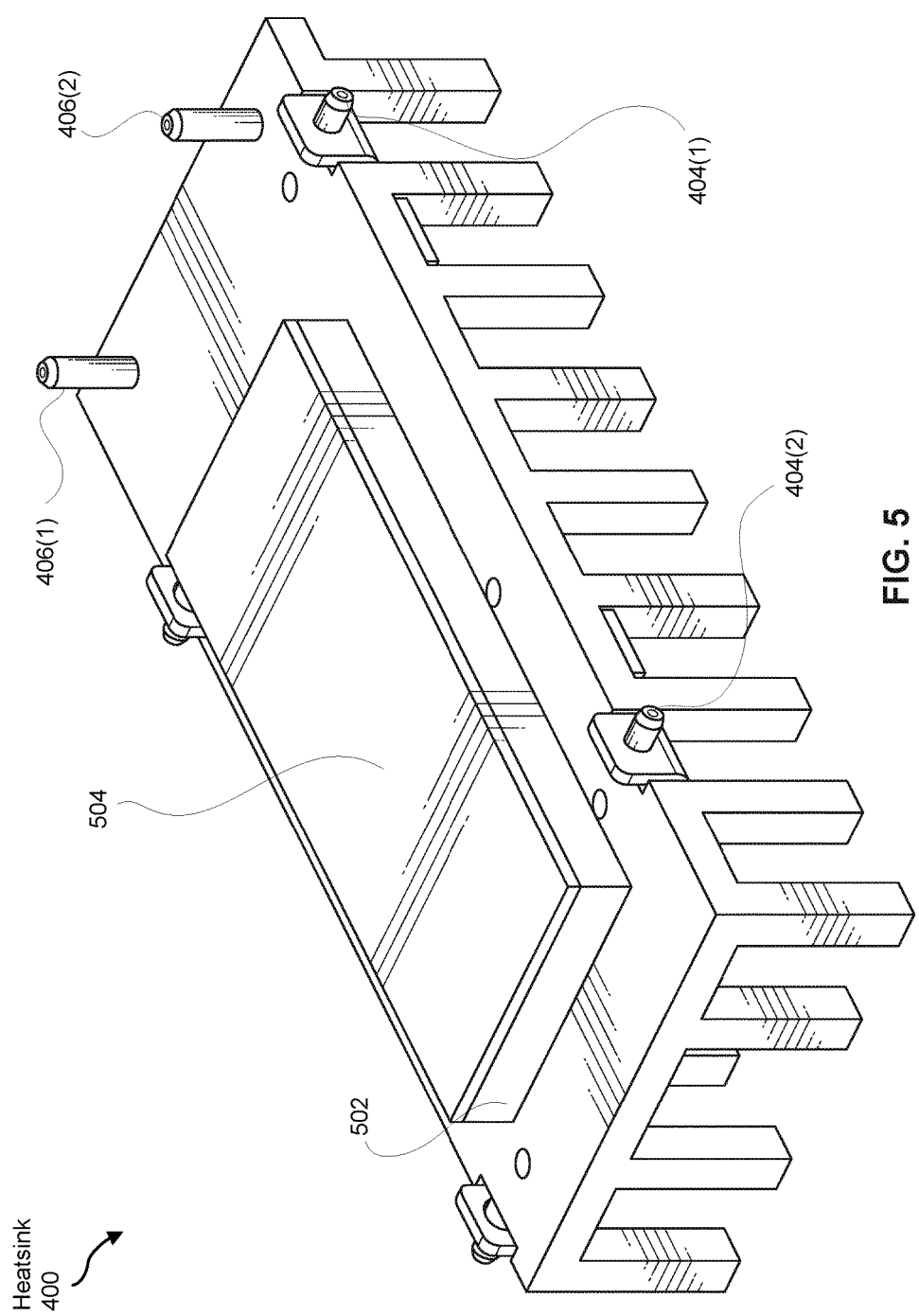
FIG. 5 is an additional illustration of a heatsink that removably interfaces with a field-replaceable electronic module installed in a cage of a computing device.

FIG. 5 shows exemplary heatsink 400 from a different perspective than FIG. 4. As illustrated in FIG. 5, heatsink 400 may include stopper pins 406(1) and 406(2) that interface with a field-replaceable electronic module. In this example, heatsink 400 may also include an extension 502 that is designed to make physical and/or thermal contact with the field-replaceable electronic module. Extension 502 may fit in hole 302 of cage 300 in FIG. 3 to establish physical and/or thermal contact with the field-replaceable electronic module.

As illustrated in FIG. 5, heatsink 400 may further include a compressible thermal interface material 504 that is coupled to extension 502. In this example, compressible thermal interface material 504 may be compressed between the field-replaceable electronic module and extension 502 of heatsink 400. In one example, compressible thermal interface material 504 may include and/or represent a gap pad. Such a gap pad may be flexible, malleable, compressible, formable, and/or shapeable to account for electronic module height tolerance variations and/or cage tolerance variations. Additionally or alternatively, the gap pad may cushion and/or buffer the contact between heatsink 400 and the field-replaceable electronic module to avoid scratching and/or damaging the field-replaceable electronic module.

Figure 6:
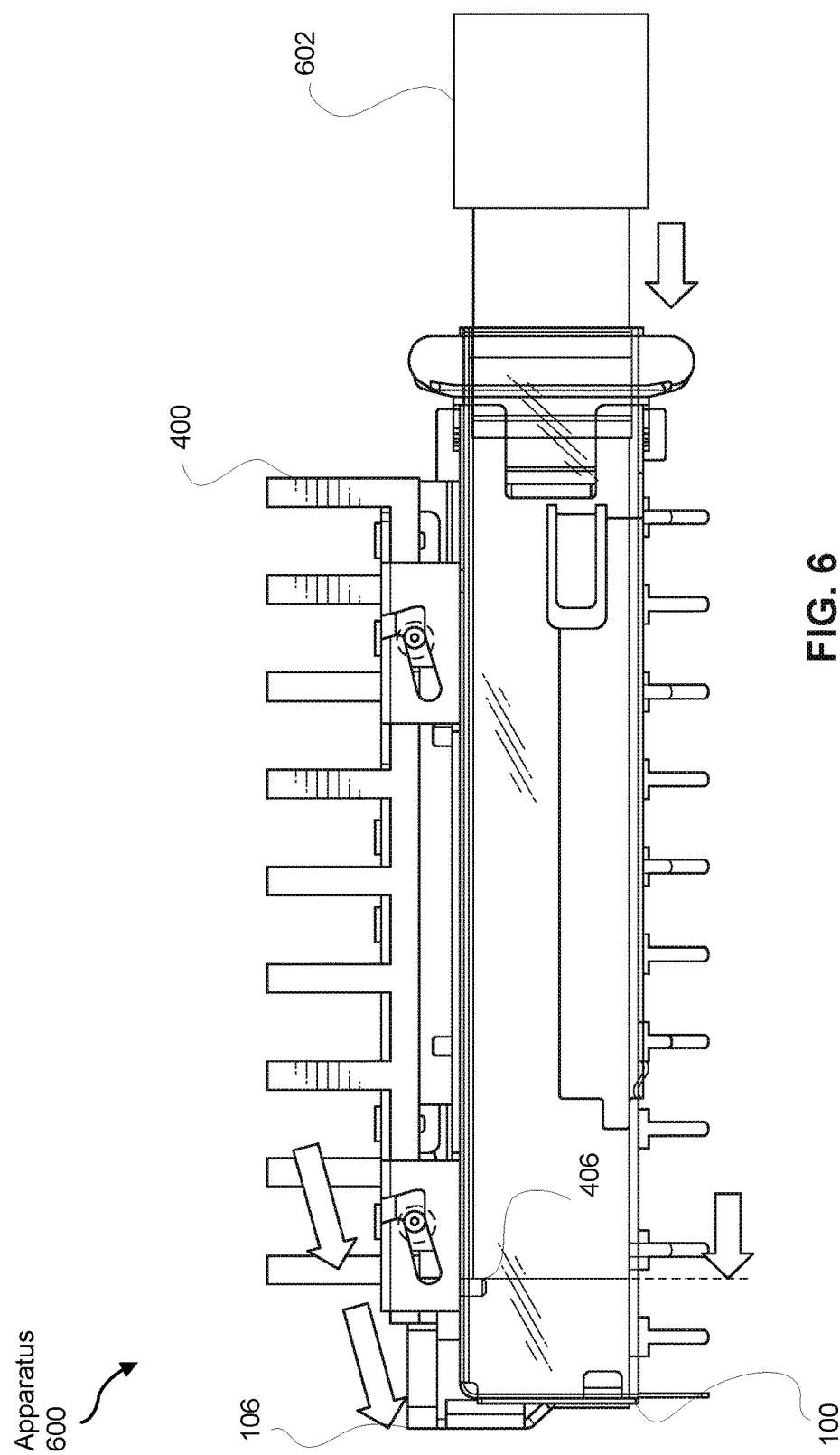
FIG. 6 is an additional illustration of an exemplary apparatus for improved thermal contact between heatsinks and field-replaceable electronic modules.

FIG. 6 shows an exemplary apparatus 600 for improved thermal contact between heatsink 400 and a field-replaceable electronic module 602. As illustrated FIG. 6, apparatus 600 may include cage 100, heatsink 400, and field-replaceable electronic module 602. In this example, as field-replaceable electronic module 602 is inserted into cage 100, field-replaceable electronic module 602 may press against stopper pin 406. As a result, field-replaceable electronic module 602 may push heatsink 400 downward into the slide profile ramps. In other words, field-replaceable electronic module 602 may apply force and/or pressure on heatsink 400 such that heatsink 400 moves deeper into the sliding profile ramps and away from the entry points of the sliding profile ramps.

Figure 7:
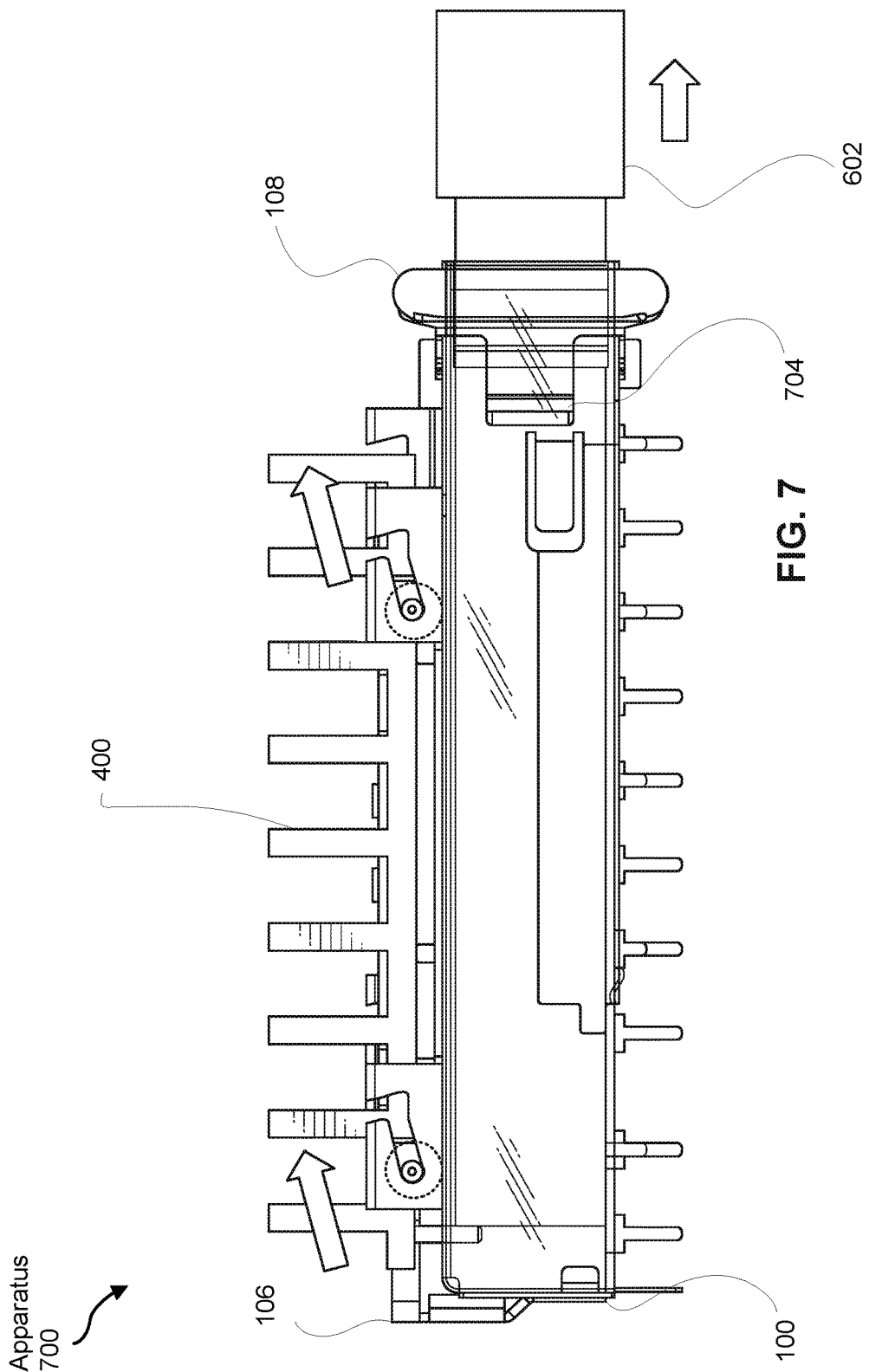
FIG. 7 is an additional illustration of an exemplary apparatus for improved thermal contact between heatsinks and field-replaceable electronic modules.

FIG. 7 shows an exemplary apparatus 700 for improved thermal contact between heatsink 400 and a field-replaceable electronic module 602. As illustrated FIG. 7, apparatus 700 may include cage 100, heatsink 400, and field-replaceable electronic module 602. In this example, once field-replaceable electronic module 602 is fully inserted into cage 100, field-replaceable electronic module 602 may lock into cage 100 by way of a locking mechanism 704. Spring mechanism 106 may then apply force to heatsink 400 such that heatsink 400 is pushed back toward the front entry side of cage 100. This pushback toward the front entry side of cage 100 may cause heatsink 400 to establish and/or maintain physical and/or thermal contact with field-replaceable electronic module 602, which is locked in place by locking mechanism 704.

Figure 8:
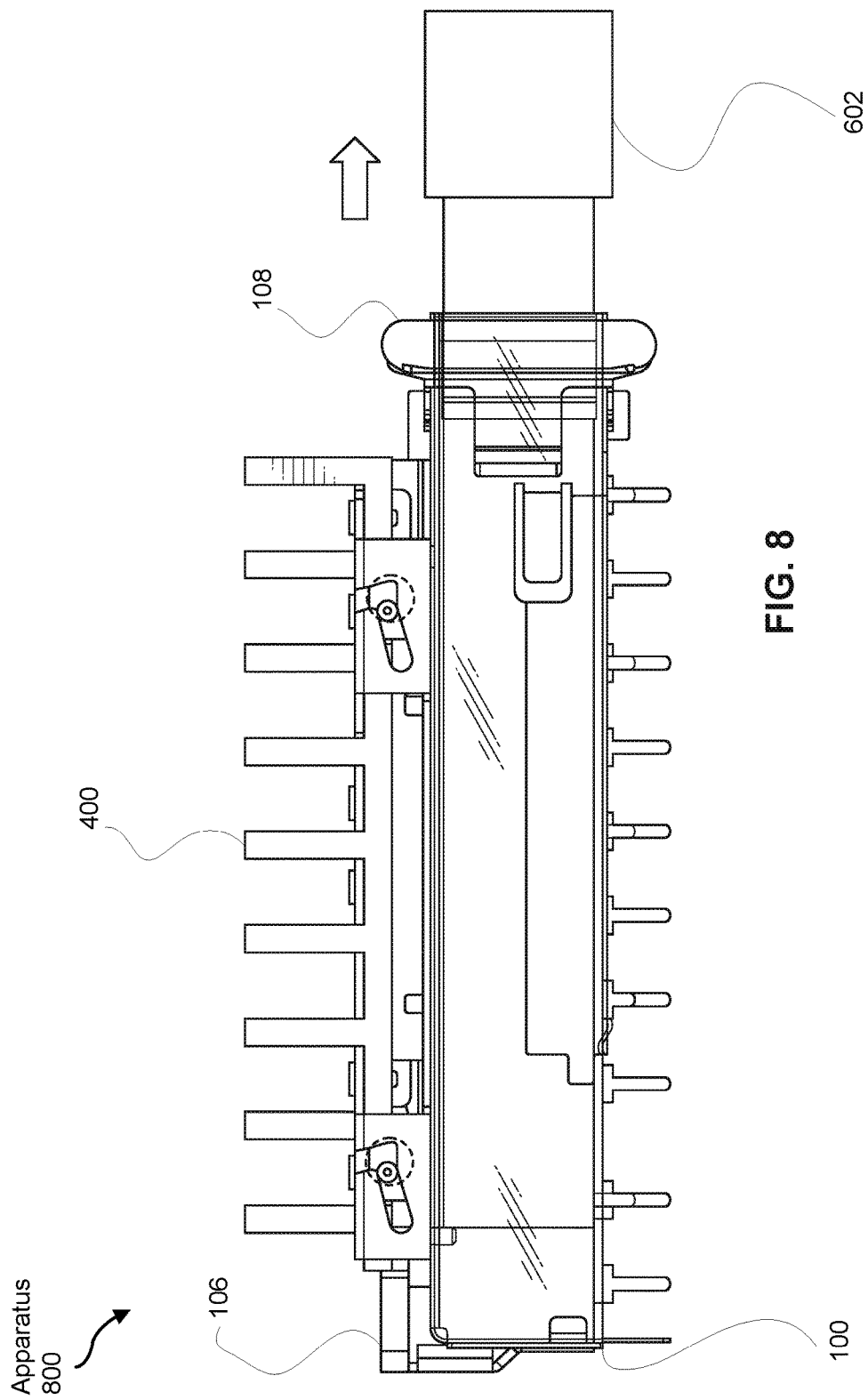
FIG. 8 is an additional illustration of an exemplary apparatus for improved thermal contact between heatsinks and field-replaceable electronic modules.

FIG. 8 shows an exemplary apparatus 800 for improved thermal contact between heatsink 400 and a field-replaceable electronic module 602. As illustrated FIG. 8, apparatus 800 may include cage 100, heatsink 400, and field-replaceable electronic module 602. In this example, when locking mechanism 704 is released, spring mechanism 106 may push heatsink 400 out toward the entry points of the sliding profile ramps. Additionally or alternatively, by pushing heatsink 400 in this direction, spring mechanism 106 may also indirectly push field-replaceable electronic module 602 out of cage 100 toward the front entry side when locking mechanism 704 is released. In other words, as heatsink 400 is pushed in this direction, the stopper pins on heatsink 400 may apply force to field-replaceable electronic module 602, thereby pushing field-replaceable electronic module 602 out of cage 100.

Figure 9:
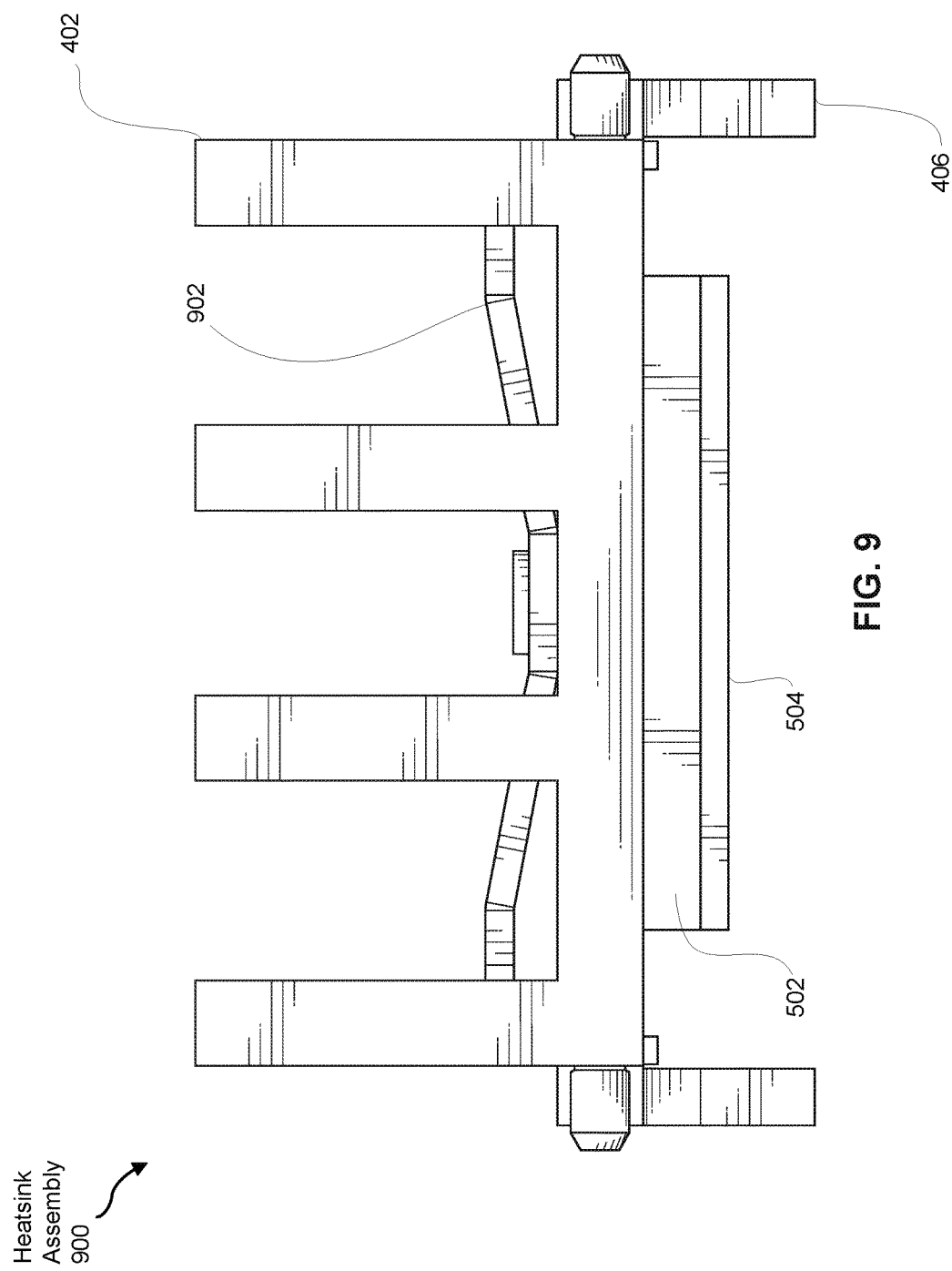
FIG. 9 is an additional illustration of an exemplary apparatus for improved thermal contact between heatsinks and field-replaceable electronic modules.

FIG. 9 shows an exemplary heatsink assembly 900 that removably interfaces with a field-replaceable electronic module installed in a cage of a computing device. As illustrated in FIG. 9, heatsink assembly 900 may include and/or represent a pin fin heatsink. Although FIG. 9 shows a pin fin heatsink, various other types or forms of heatsinks may be mounted to the cage. In this example, heatsink assembly 900 may include various pins that extend from a base. Heatsink assembly 900 may also include guide pins. These guide pins may interface with sliding profile ramps 104(1)-(4) of cage 100. Accordingly, these guide pins may enable heatsink assembly 900 to mount onto cage 100 by way of sliding profile ramps 104(1)-(4) to establish thermal contact with the field-replaceable electronic module.

As illustrated in FIG. 9, heatsink assembly 900 may further include at least one stopper pin 406 that interfaces with the field-replaceable electronic module. In this example, stopper pin 406 may enable the field-replaceable electronic module to push heatsink assembly 900 into sliding profile ramps 104(1)-(4) such that heatsink assembly 900 establishes thermal contact with the field-replaceable electronic module. Heatsink assembly 900 may also include extension 502 that is designed to make physical and/or thermal contact with the field-replaceable electronic module. Extension 502 may fit in hole 302 of cage 300 in FIG. 3 to establish physical and/or thermal contact with the field-replaceable electronic module.

As illustrated in FIG. 9, heatsink assembly 900 may further include compressible thermal interface material 504 that is coupled to extension 502. In this example, compressible thermal interface material 504 may be compressed between the field-replaceable electronic module and extension 502 of heatsink assembly 900. Additionally or alternatively, the gap pad may cushion and/or buffer the contact between heatsink assembly 900 and the field-replaceable electronic module to avoid scratching and/or damaging the field-replaceable electronic module.

As illustrated in FIG. 9, heatsink assembly 900 may also include a spring plate 902. In one example, spring plate 902 may be coupled to the heatsink. For example, spring plate 902 may be coupled to the heatsink by a fastener and/or a screw. In another example, spring plate 902 may be coupled to the heatsink by an adhesive. When heatsink assembly 900 is installed in cage 100, 200, or 300, spring plate 902 may apply force to the heatsink such that the heatsink is pressed against the field-replaceable electronic module. This force may cause the heatsink to establish and/or maintain thermal contact with the field-replaceable electronic module to facilitate heat transfer from the field-replaceable electronic module to the heatsink.

In some examples, spring plate 902 may include and/or represent a leaf spring. In one example, spring plate 902 may perform a function similar to spring mechanism 106. In this example, spring plate 902 may, in conjunction with spring mechanism 106, apply force on the heatsink. In other words, spring plate 902 and spring mechanism 106 may work together in applying the force on the heatsink to ensure that the heatsink establishes thermal contact with the field-replaceable electronic module. By working together in this way, spring plate 902 and spring mechanism 106 may increase and/or strengthen the thermal contact between the heatsink and the field-replaceable electronic module.

In another example, spring plate 902 may alone apply the force that establishes the thermal contact between the heatsink and the field-replaceable electronic module. In other words, although not illustrated in this way in FIG. 1, the cage may fail to include and/or incorporate spring mechanism 106. Accordingly, spring plate 902 may apply the force on the heatsink without any force being applied by spring mechanism 106. In this example, spring plate 902 and spring mechanism 106 may represent alternative sources of the force applied on the heatsink.

Figure 10:
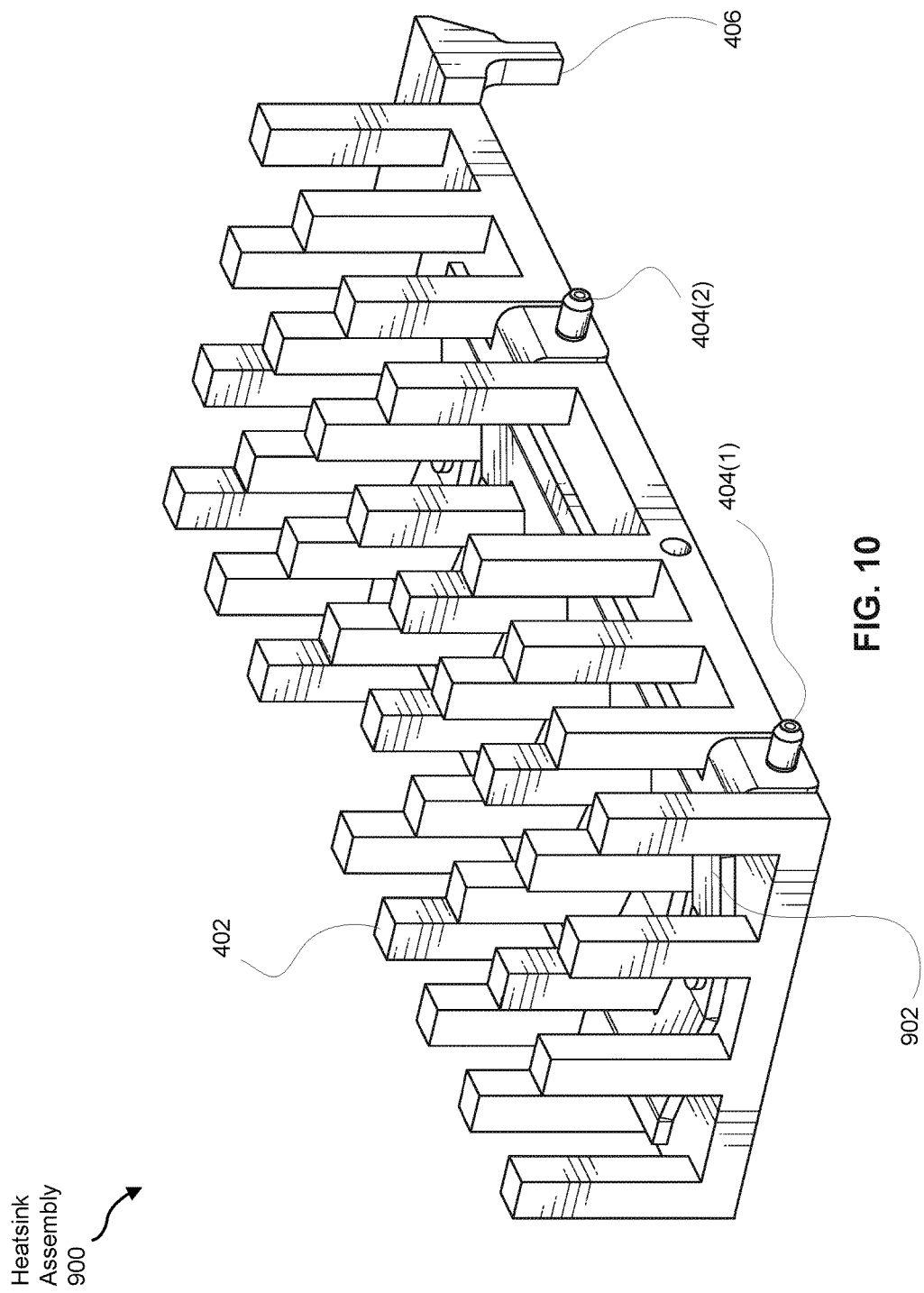
FIG. 10 is an additional illustration of an exemplary apparatus for improved thermal contact between heatsinks and field-replaceable electronic modules.

FIG. 10 shows exemplary heatsink assembly 900 that removably interfaces with a field-replaceable electronic module installed in a cage of a computing device. As illustrated in FIG. 10, heatsink assembly 900 may include guide pins 404(1) and 404(2) (as well as others located on the opposed side not illustrated in FIG. 10). These guide pins may interface with sliding profile ramps 104(1)-(4) of cage 100. Accordingly, these guide pins may enable heatsink 400 to mount onto cage 100 by way of sliding profile ramps 104(1)-(4) to establish thermal contact with the field-replaceable electronic module.

As illustrated in FIG. 10, heatsink assembly 900 may further include stopper pin 406 that interfaces with the field-replaceable electronic module. In this example, stopper pin 406 may enable the field-replaceable electronic module to push heatsink assembly 900 into sliding profile ramps 104(1)-(4) such that heatsink assembly 900 establishes thermal contact with the field-replaceable electronic module.

As illustrated in FIG. 10, heatsink assembly 900 may also include a spring plate 902. In this example, spring plate 902 may be coupled to the heatsink. Spring plate 902 may be coupled to the heatsink by a fastener, a screw, and/or an adhesive. When heatsink assembly 900 is installed in cage 100, 200, or 300, spring plate 902 may apply force to the heatsink such that the heatsink is pressed against the field-replaceable electronic module. This force may cause the heatsink to establish and/or maintain thermal contact with the field-replaceable electronic module to facilitate heat transfer from the field-replaceable electronic module to the heatsink.

In one example, spring plate 902 may include and/or incorporate guide pins 404(1) and 404(2) (as well as others located on the opposed side not illustrated in FIG. 10). Accordingly, when heatsink assembly 900 is installed in cage 100, 200, or 300, spring plate 902 may apply the force to the heatsink by engaging with profile ramps 104(1)-(4) via guide pins 404(1) and 404(2).

Figure 11:
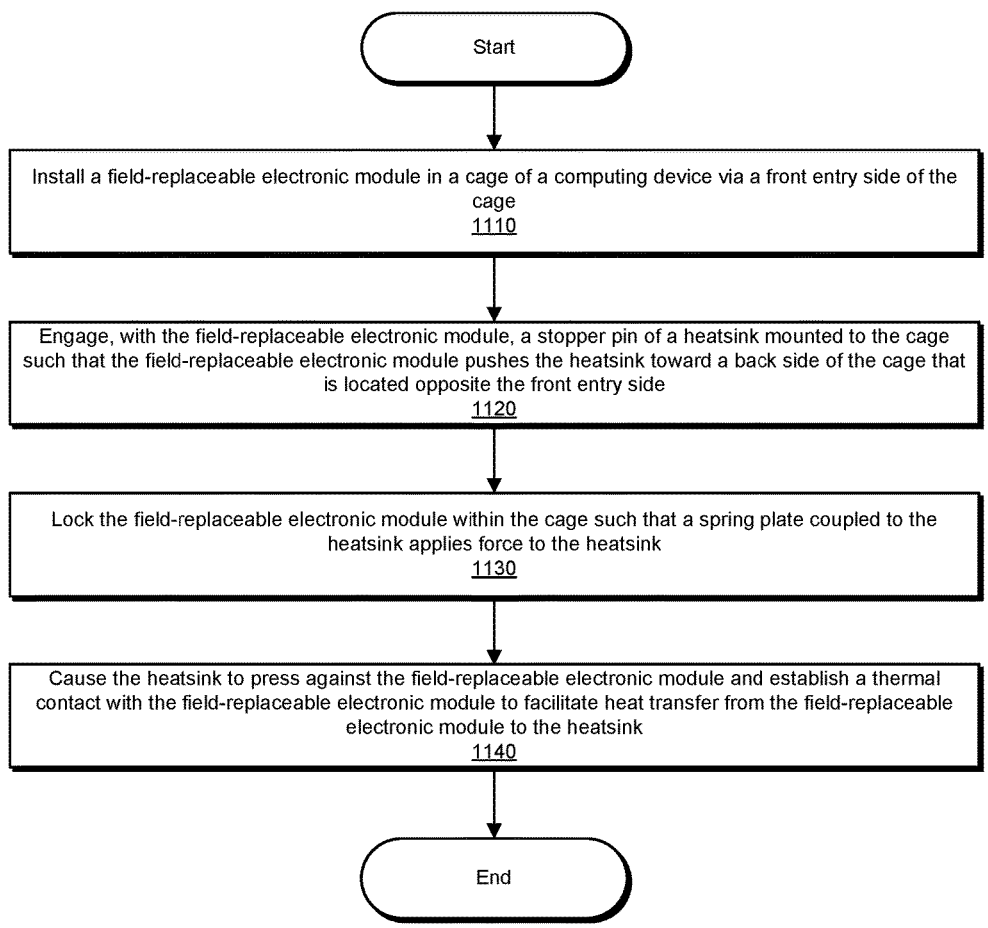
FIG. 11 is a flow diagram of an exemplary method for improved thermal contact between heatsinks and field-replaceable electronic modules.

FIG. 11 is a flow diagram of an exemplary method 1100 for improved thermal contact between heatsinks and field-replaceable electronic modules. Method 1100 may include the step of installing a field-replaceable electronic module in a cage of a computing device via a front side of the cage (1110). This installing step may be performed in a variety of ways. For example, a telecommunications equipment manufacturer may manually and/or robotically install a field-replaceable electronic module in a cage of a router via a front side of the cage. Additionally or alternatively, a network administrator may manually and/or robotically install a field-replaceable electronic module in a cage of a router via a front side of the cage.

Returning to FIG. 11, method 1100 may also include the step of engaging, with the field-replaceable electronic module, a stopper pin of a heatsink mounted to the cage such that the field-replaceable electronic module pushes the heatsink toward a back side of the cage that is located opposite the front entry side (1120). This engaging step may be performed in a variety of ways. For example, during installation of the field-replaceable electronic module, a telecommunications equipment manufacturer may engage, with the field-replaceable electronic module, a stopper pin of a heatsink mounted to the cage such that the field-replaceable electronic module pushes the heatsink toward a back side of the cage that is located opposite the front entry side. Additionally or alternatively, during installation of the field-replaceable electronic module, a network administrator may engage, with the field-replaceable electronic module, a stopper pin of a heatsink mounted to the cage such that the field-replaceable electronic module pushes the heatsink toward a back side of the cage that is located opposite the front entry side.

Returning to FIG. 11, method 1100 may also include the step of locking the field-replaceable electronic module within the cage such that a spring plate coupled to the heatsink applies force to the heatsink (1130). This locking step may be performed in a variety of ways. For example, during installation of the field-replaceable electronic module, a telecommunications equipment manufacturer may lock the field-replaceable electronic module within the cage such that a spring plate coupled to the heatsink applies force to the heatsink. Additionally or alternatively, during installation of the field-replaceable electronic module, a network administrator may lock the field-replaceable electronic module within the cage such that a spring plate coupled to the heatsink applies force to the heatsink.

Returning to FIG. 11, method 1100 may also include the step of causing, as a result of the force applied to the heatsink by the spring plate, the heatsink to press against the field-replaceable electronic module and establish a thermal contact with the field-replaceable electronic module to facilitate heat transfer from the field-replaceable electronic module to the heatsink (1140). This causing step may be performed in a variety of ways. For example, the force applied by the spring plate may cause the heatsink to press against the field-replaceable electronic module and establish a thermal contact with the field-replaceable electronic module to facilitate heat transfer from the field-replaceable electronic module to the heatsink.

While the foregoing disclosure sets forth various embodiments using specific illustrations, flowcharts, and examples, each illustration component, flowchart step, operation, and/or component described and/or exemplified herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
  a cage that houses at least one field-replaceable electronic module that, when operational, emits heat within a computing device, wherein the cage comprises:
    a front entry side that facilitates installation of the field-replaceable electronic module; and
    a back side that is located opposite the front entry side;
  a heatsink that removably interfaces with the field-replaceable electronic module when the field-replaceable electronic module is installed in the cage;
  a spring plate that:
    is coupled to the heatsink;
    applies force to the heatsink such that the heatsink:
      is pressed against the field-replaceable electronic module; and
      establishes thermal contact with the field-replaceable electronic module to facilitate heat transfer from the field-replaceable electronic module to the heatsink;
  a spring mechanism that:
    is coupled to the back side of the cage; and
    applies further force to the heatsink such that the heatsink is further pressed against the field-replaceable electronic module; and
  wherein:
    the cage comprises a locking mechanism that secures the field-replaceable electronic module within the cage such that the spring mechanism is able to apply force to the heatsink to establish thermal contact with the field-replaceable electronic module;
    the spring mechanism pushes the field-replaceable electronic module toward the front entry side of the cage when the locking mechanism is released;
    the cage comprises at least one sliding profile ramp that:
      facilitates mounting the heatsink onto the cage; and
      includes an entry point at which the heatsink enters and exits the sliding profile ramp; and
    the spring mechanism pushes the heatsink toward the entry point of the sliding profile ramp when the locking mechanism is released and the field-replaceable electronic module is pushed out of the cage.

2. The apparatus of claim 1, wherein:
  the cage comprises at least one sliding profile ramp;
  the heatsink comprises at least one guide pin that:
    interfaces with the sliding profile ramp of the cage; and
    enables the heatsink to mount onto the cage by way of the sliding profile ramp to establish thermal contact with the field-replaceable electronic module.

3. The apparatus of claim 2, wherein the heatsink comprises at least one stopper pin that:
  interfaces with the field-replaceable electronic module; and
  enables the field-replaceable electronic module to push the heatsink into the sliding profile ramp such that the heatsink establishes thermal contact with the field-replaceable electronic module.

4. The apparatus of claim 1, wherein the heatsink comprises an extension that fits in a hole of the cage to make contact with the field-replaceable electronic module;
  further comprising a compressible thermal interface material that:
    is coupled to the extension of the heatsink; and
    is compressed between the field-replaceable electronic module and the extension of the heatsink.

5. The apparatus of claim 4, wherein the compressible thermal interface material comprises a thermal gap pad.

6. The apparatus of claim 1, wherein the heatsink comprises at least one of:
  a pin fin heatsink; and
  a finned heatsink.

7. The apparatus of claim 1, wherein the field-replaceable electronic module comprises an optical transceiver.

8. The apparatus of claim 1, further comprising a spring mechanism that:
  is coupled to the back side of the cage; and
  applies further force to the heatsink such that the heatsink is further pressed against the field-replaceable electronic module.

9. The apparatus of claim 8, wherein spring mechanism establishes further thermal contact with the field-replaceable electronic module to facilitate further heat transfer from the field-replaceable electronic module to the heatsink.

10. The apparatus of claim 1, wherein the spring plate comprises a leaf spring.

11. A network device comprising:
a cage that houses at least one field-replaceable electronic module that, when operational, emits heat within a computing device, wherein the cage comprises:
- a front entry side that facilitates installation of the field-replaceable electronic module; and
- a back side that is located opposite the front entry side;

a heatsink that removably interfaces with the field-replaceable electronic module when the field-replaceable electronic module is installed in the cage; and
a spring mechanism that:
- is coupled to the back side of the cage;
- applies force to the heatsink such that the heatsink:
  - is pressed against the field-replaceable electronic module; and
  - establishes thermal contact with the field-replaceable electronic module to facilitate heat transfer from the field-replaceable electronic module to the heatsink;

wherein:
- the cage comprises at least one sliding profile ramp;
- the heatsink comprises at least one guide pin that:
  - interfaces with the sliding profile ramp of the cage; and
  - enables the heatsink to mount onto the cage by way of the sliding profile ramp to establish thermal contact with the field-replaceable electronic module.

12. The network device of claim 11, wherein the heatsink comprises at least one stopper pin that:
- interfaces with the field-replaceable electronic module; and
- enables the field-replaceable electronic module to push the heatsink into the sliding profile ramp such that the heatsink establishes thermal contact with the field-replaceable electronic module.

13. The network device of claim 11, further comprising a spring mechanism that:
- is coupled to the back side of the cage; and
- applies further force to the heatsink such that the heatsink is further pressed against the field-replaceable electronic module.

14. The network device of claim 13, wherein spring mechanism establishes further thermal contact with the field-replaceable electronic module to facilitate further heat transfer from the field-replaceable electronic module to the heatsink.

15. The network device of claim 14, wherein the cage comprises a locking mechanism that secures the field-replaceable electronic module within the cage such that the spring mechanism is able to apply force to the heatsink to establish thermal contact with the field-replaceable electronic module.

16. A method comprising:
installing a field-replaceable electronic module in a cage of a network device via a front entry side of the cage;
during installation of the field-replaceable electronic module:
- engaging, with the field-replaceable electronic module, a stopper pin of a heatsink mounted to the cage such that the field-replaceable electronic module pushes the heatsink toward a back side of the cage that is located opposite the front entry side;
- locking the field-replaceable electronic module within the cage such that a spring plate coupled to the heatsink applies force to the heatsink; and
- as a result of the force applied to the heatsink by the spring plate, causing the heatsink to press against the field-replaceable electronic module and establish a thermal contact with the field-replaceable electronic module to facilitate heat transfer from the field-replaceable electronic module to the heatsink;

wherein:
- the cage comprises at least one sliding profile ramp;
- the heatsink comprises at least one guide pin that:
  - interfaces with the sliding profile ramp of the cage; and
  - enables the heatsink to mount onto the cage by way of the sliding profile ramp to establish the thermal contact with the field-replaceable electronic module.

* * * * *